(12) United States Patent
Kao

(10) Patent No.: US 7,710,754 B2
(45) Date of Patent: May 4, 2010

(54) METHOD OF SIMPLE CHIP SELECT FOR MEMORY SUBSYSTEMS

(75) Inventor: Rom-Shen Kao, Durham, NC (US)

(73) Assignee: Qimonda North America Corp., Cary, NC (US)

( * ) Notice: Subject to any disclaimer, the term of this patent is extended or adjusted under 35 U.S.C. 154(b) by 300 days.

(21) Appl. No.: 11/843,558

(22) Filed: Aug. 22, 2007

(65) Prior Publication Data

US 2009/0052267 A1 Feb. 26, 2009

(51) Int. Cl.
*G11C 5/02* (2006.01)
(52) U.S. Cl. ............... 365/51; 365/189.05; 365/230.06
(58) Field of Classification Search ............. 365/51–52, 365/63, 189.05, 189.07, 225.7, 230.06
See application file for complete search history.

(56) References Cited

U.S. PATENT DOCUMENTS

| 4,392,212 | A | * | 7/1983 | Miyasaka et al. | 365/230.06 |
| 4,982,265 | A | * | 1/1991 | Watanabe et al. | 257/737 |
| 5,345,412 | A | * | 9/1994 | Shiratsuchi | 365/63 |
| 5,430,859 | A | * | 7/1995 | Norman et al. | 711/103 |
| 5,587,341 | A | * | 12/1996 | Masayuki et al. | 438/109 |
| 2009/0052270 | A1 | * | 2/2009 | Kao | 365/230.06 |

* cited by examiner

*Primary Examiner*—Gene N. Auduong
(74) *Attorney, Agent, or Firm*—Patterson & Sheridan, L.L.P.

(57) ABSTRACT

Embodiments of the invention may generally provide techniques that allow a single externally supplied chip select signal to be used to independently select a plurality of devices in a multi-chip package (MCP). For some embodiments, higher order address bits are compared to device IDs assigned to each device. An internally generated chip select line is asserted for a device having a match between the address bits and its device ID.

20 Claims, 11 Drawing Sheets

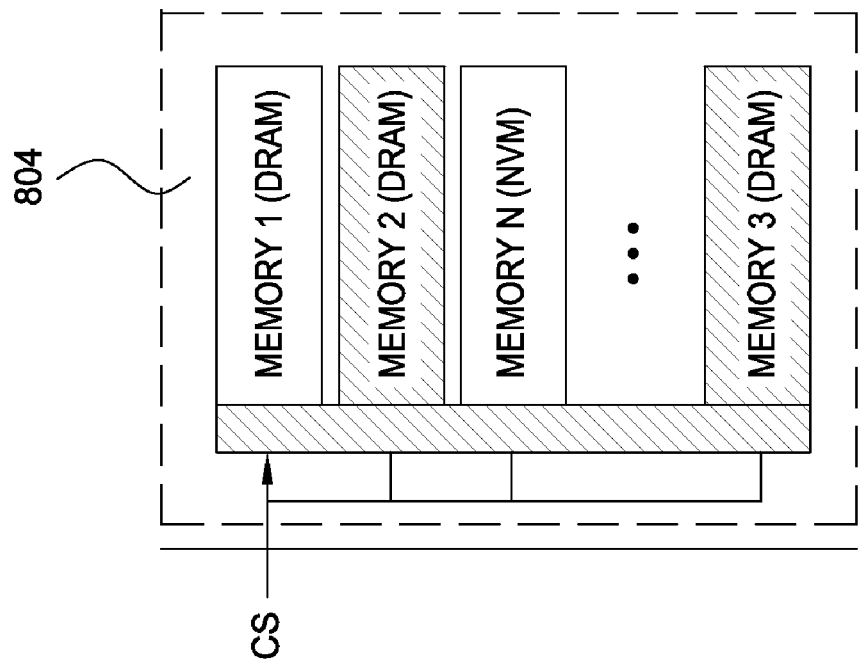
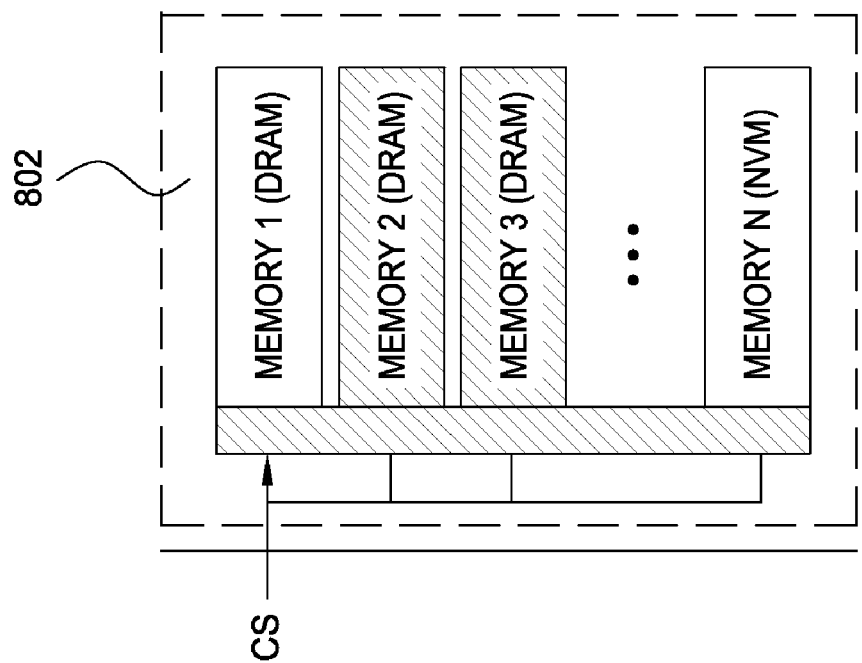
FIG. 8

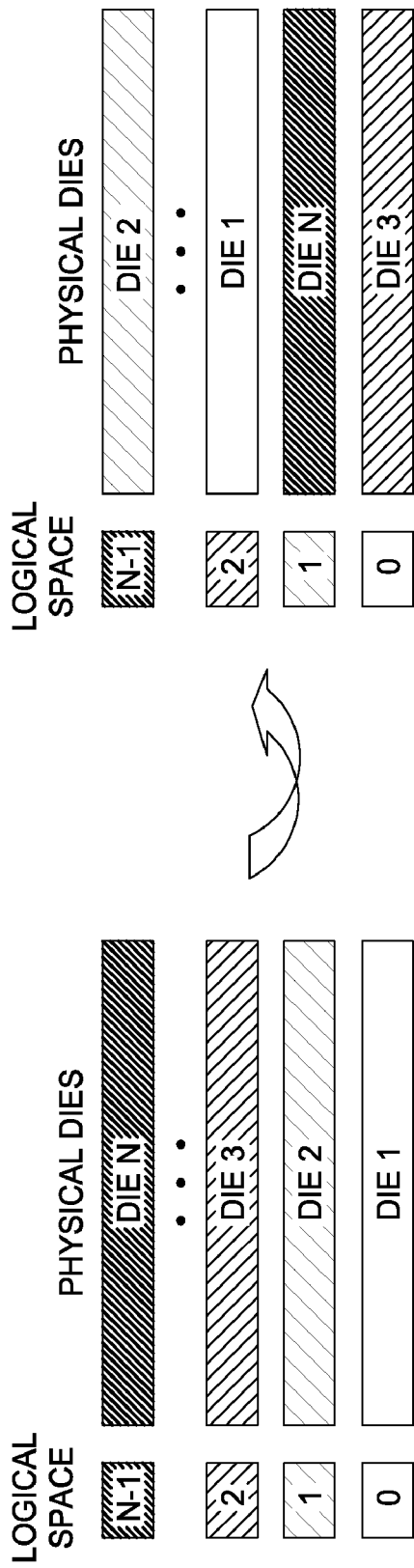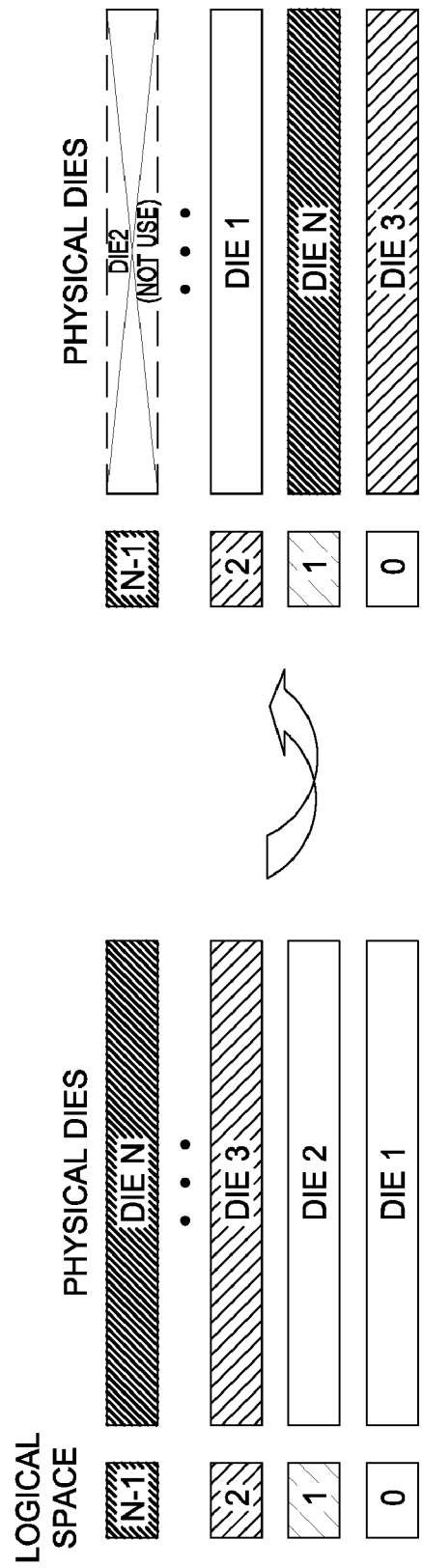

US 7,710,754 B2

METHOD OF SIMPLE CHIP SELECT FOR MEMORY SUBSYSTEMS

BACKGROUND OF THE INVENTION

Description of the Related Art

Multi-chip packages (MCPs) are individual semiconductor packages, made of plastic or ceramic, containing two or more die connected internally with wire-bonding. MCPs allow multiple devices to be integrated into a single, more compact, package with the same footprint on a printed circuit board (PCB) as a single chip device. MCPs typically contact the PCB with pins, such as solder balls or other type of conductive elements.

SUMMARY OF THE INVENTION

One embodiment provides a multi-chip package. The multi-chip package generally includes at least one chip select pin for receiving a single external chip select signal, a plurality of memory devices, where each memory device is responsive to an individual internal chip select and is assigned a different multi-bit device identification (ID), and one or more chip select logic circuits. The chip select logic circuits are configured to generate the individual internal chip select for each of the plurality of memory devices based on the external chip select signal and whether one or more external bits match the device ID.

One embodiment provides a method of selecting devices in a multi-chip package (MCP). The method generally includes receiving a single chip select signal from a source external to the MCP, receiving a plurality of address bits, identifying one of the devices to select based on a match between the address bits and a corresponding device identification (ID) bits assigned to the identified device, and asserting a chip select to select the identified device.

One embodiment provides a system generally including a controller and a multi-chip package. The a multi-chip package having at least one chip select pin for receiving a single external chip select signal from the controller, a plurality of memory devices, where each memory device is responsive to an individual internal chip select and is assigned a different multi-bit device identification (ID), and one or more chip select logic circuits configured to generate, the individual internal chip select for each of the plurality of memory devices based on the external chip select signal and whether one or more external bits match the device ID,

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 8 illustrates the reassignment of memory according to one embodiment of the present invention.

FIGS. 10A-10D illustrate memory space remapping that may be accomplished according to embodiments of the present invention.

DETAILED DESCRIPTION OF THE PREFERRED EMBODIMENT

Embodiments of the invention may generally provide techniques that allow a single externally supplied chip select signal to be used to independently select a plurality of devices in a multi-chip package (MCP). For example, for some embodiments, higher order address bits are compared to device IDs assigned to each device. An internally generated chip select line is asserted for a device having a match between the address bits and its device ID.

Figure 1:
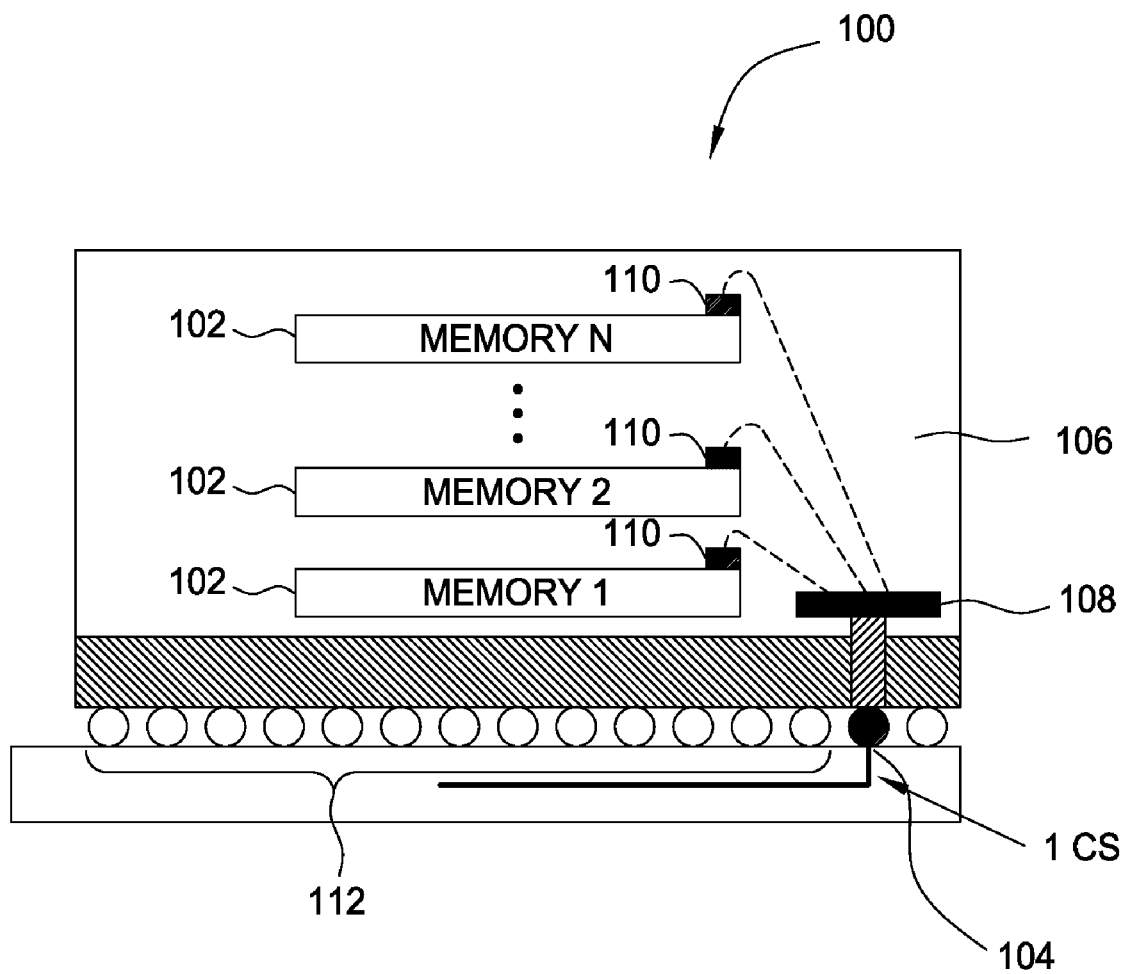
FIG. 1 illustrates an example multi-chip package (MCP) according to one embodiment of the present invention.

FIG. 1 is a block diagram illustrating an embodiment of a multi-chip package (MCP) 100 employing a plurality of memory devices 102, a chip select logic circuit 108, and an external chip select pin 104 within an overall encapsulation material 106. Each memory device 102 can be a DRAM, FLASH, or any other volatile or non-volatile memory. Additionally, the memory devices 102 in the MCP 100 do not have to be of the same type.

Each memory device 102 is accessed via its own individual internally-generated chip select 110. For one embodiment, the internal chip selects 110 may be driven by the chip select logic circuits 108 integrated in each device, which are configured to generate the individual internal chip select 110 for each memory device 102 based on the external chip select pin 104 and other external bits 112, for example address bits. For another embodiment, the chip select logic circuit 108 may be located elsewhere on the MCP 100, for example, in a separate device that generates chip selects that are routed to each device (e.g., via wirebonding).

Figure 2A:
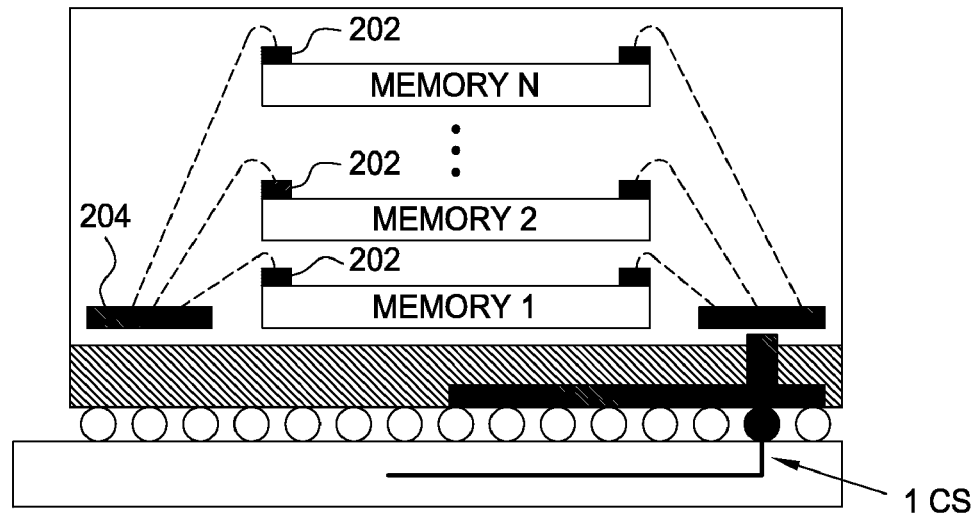
FIGS. 2A and 2B illustrate the designation of device IDs via wirebonding according to one embodiment of the invention.

Regardless, the internal chip select signals are generated based on a match between the additional bits and a device identification (ID) corresponding to each device. The device ID may be set in a variety of different ways. FIG. 2A illustrates one embodiment of the invention, where the device ID's 202 are set to a fixed configuration at a wire bonding level 204. One embodiment of the invention uses pull-up and/or pull-down resistors to hardcode the values of the device ID 202 at the wire bonding level 204.

Figure 2B:
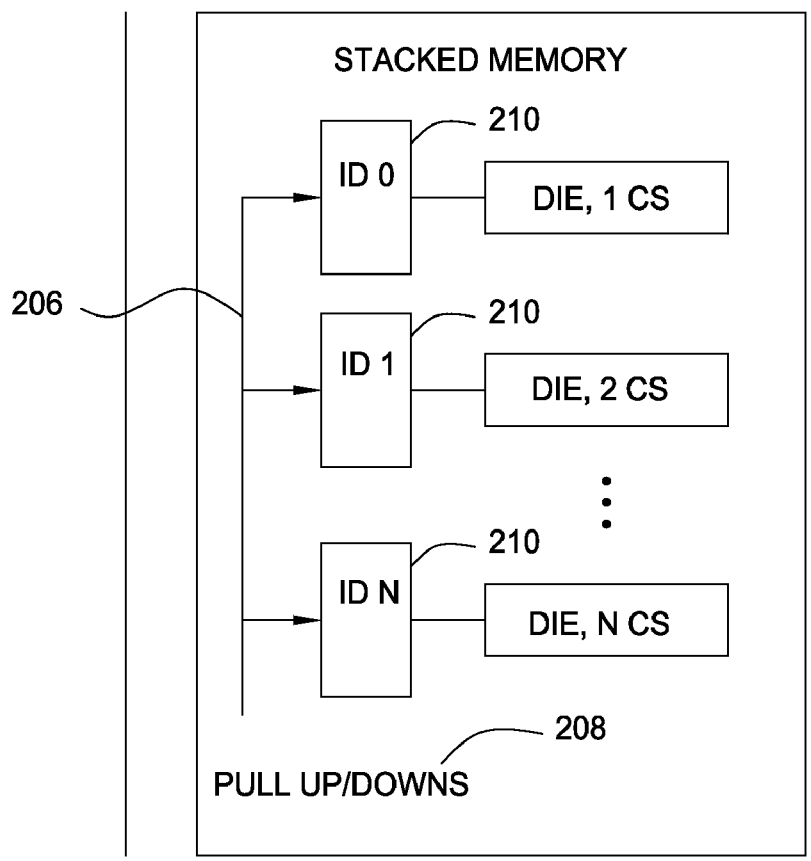

FIG. 2B is a logical representation of an embodiment of the invention, where the wires 206 driven by the pull-up and/or pull-down resistors 208 in order to preset the device ID's 202 are latched into registers 210.

Figure 3A:
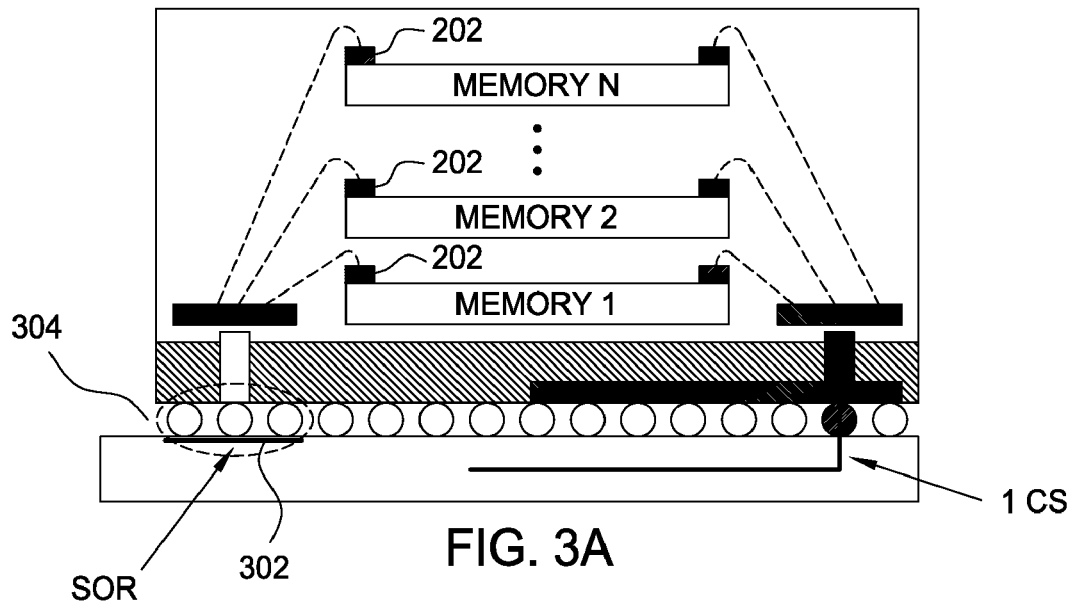
FIGS. 3A and 3B illustrate the designation of device IDs via sense on reset (SOR) according to another embodiment of the invention.
Figure 3B:
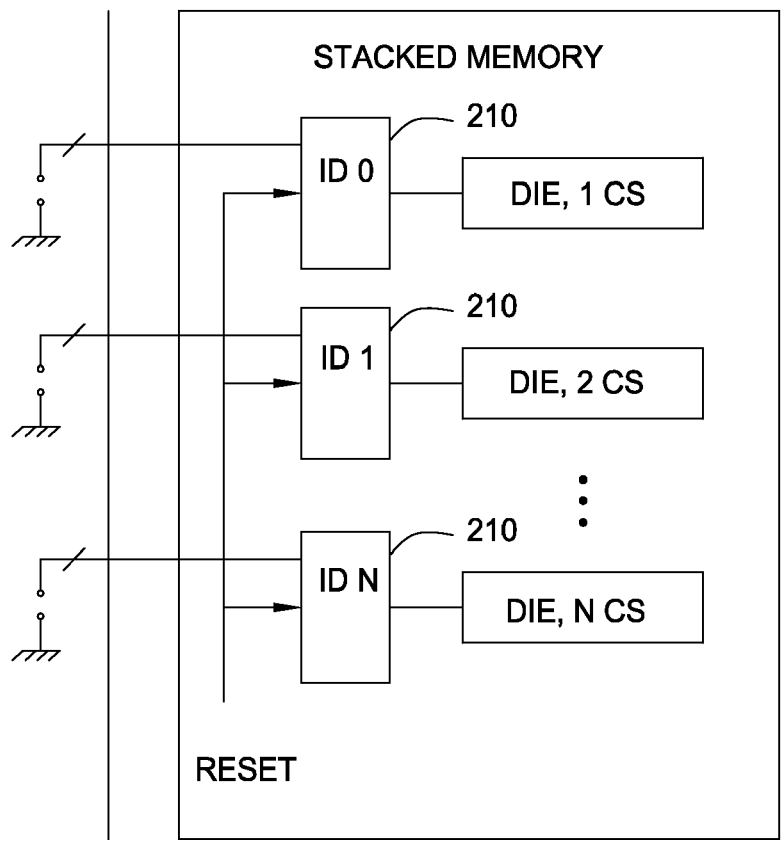

Another embodiment of the invention allows the device ID's 202 to be preset during reset, a process commonly referred to as Sense on Reset. For example, FIG. 3A illustrates the use of a sense-on-reset (SOR) 302. While in reset, a group of pins 304 are driven to certain values to preset the device ID 202. As illustrated in FIG. 3B, the SOR signals may be latched into device ID registers 210 for use during normal operation. After reset is de-asserted, the device ID 202 is set and the pins 304 used to preset the device ID 202 are returned to their normal functionality, for example address and data pins.

Figure 4:
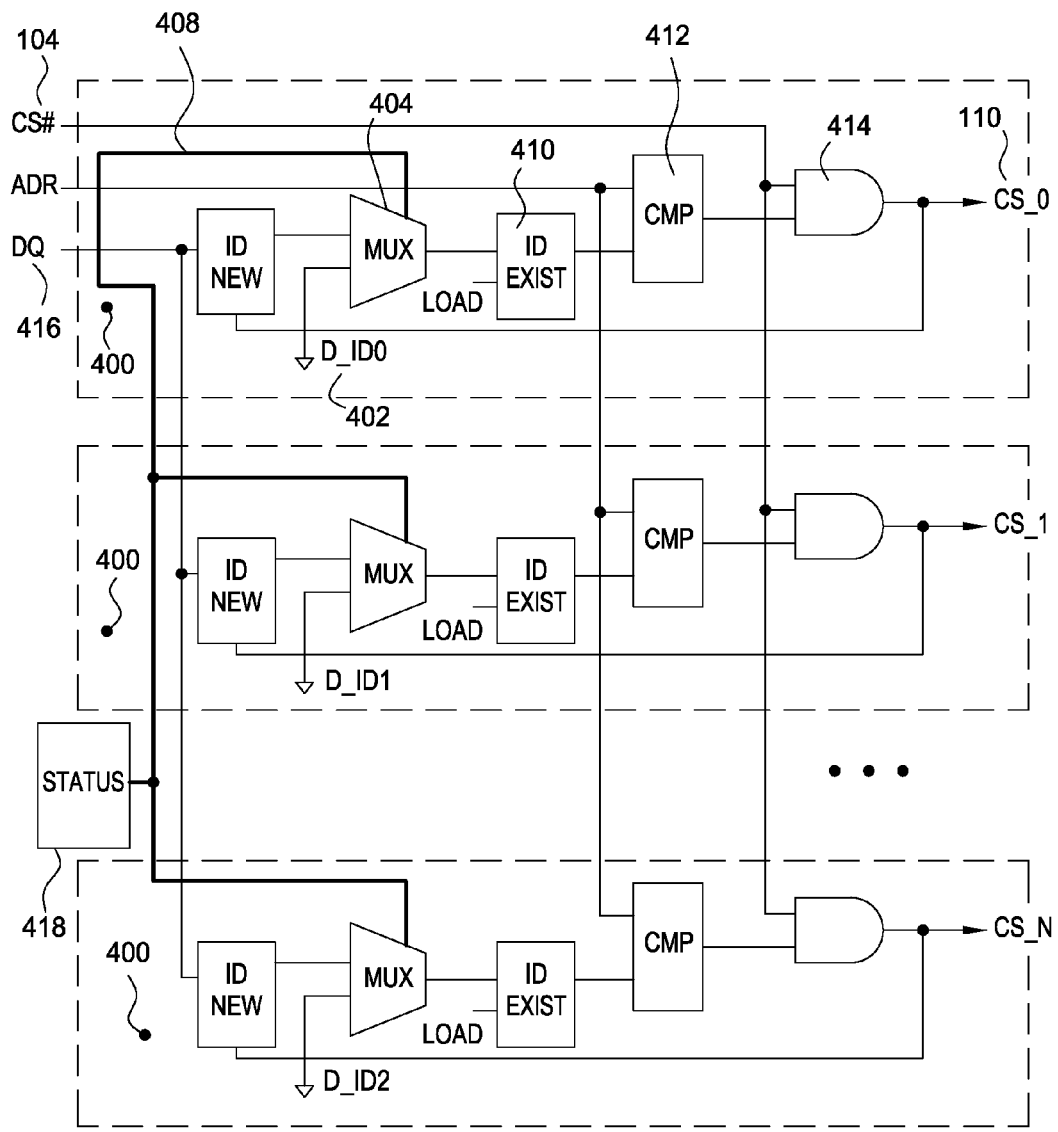
FIG. 4 is a logical representation of a plurality of chip select logic circuits according to one embodiment of the present invention.
Figure 5:
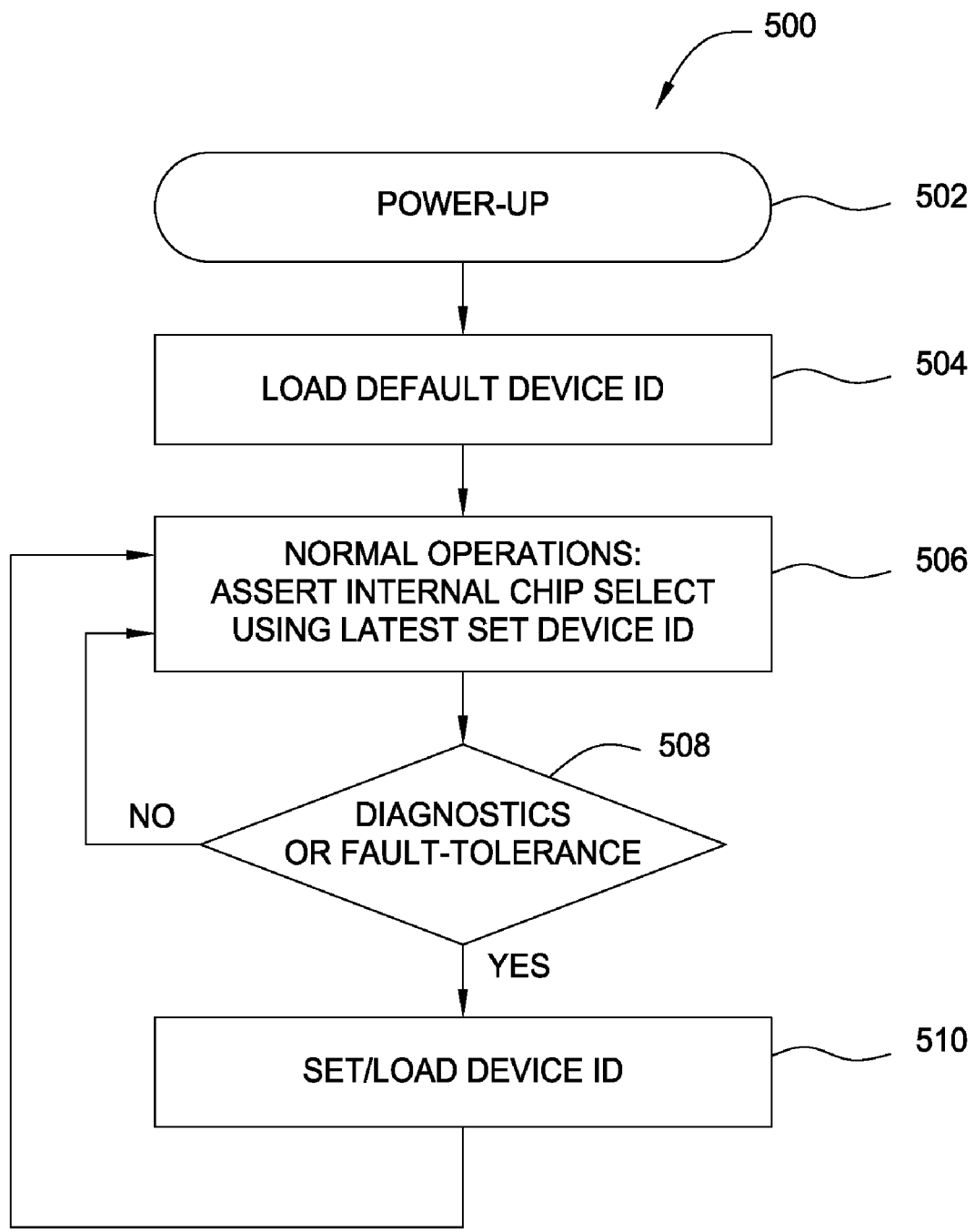
FIG. 5 is a flowchart of example operations for designating device IDs according to FIG. 4 of the present invention.

Another embodiment of the invention allows the device ID's to be programmable via software, for example, allowing default device ID's (set by any of the techniques described above) to be overridden by a host controller. FIG. 4 illustrates a plurality of chip select circuits 400 which allow flexible memory die assignment which incorporate the embodiments mentioned above. The circuits may be best described using the flowchart of FIG. 5, which illustrates example operations 500 for presetting and reprogramming the device ID's.

The operations begin, at step 502, at device power-up. At step 504, a default device ID is preset for each device. The default device IDs may be set by sense-on-reset or by pull-up/pull-down resistors as described above.

FIG. 4 illustrates the use of either embodiment to set default values, and merely illustrates the resulting signals sensed as D_ID0 and D_ID1 402, regardless of whether they are set via wirebonding or SOR. The default ID signals 402 are input to a mux circuit 404, which may be controlled to output the default (SOR or wirebonded) device ID (D_ID) signals during normal operation. For example, the output of the mux may be controlled by a select line 408, which is driven by a status register 418 that indicates if the circuit is in a diagnostic mode. During normal operation, the select line 408 may be driven in a manner such that the mux outputs the D_ID signals, which may be latched in device ID register latches 410. However, as will be discussed in greater detail below, the device ID register latches 410 may be reprogrammed with a new device ID, thus overriding the D_ID signals outputted from the mux during normal operation.

During normal operation (step 506), the latest device ID setting stored in the device ID latches 410 are used. Referring again to FIG. 4, the device ID bits outputted from the device ID latches 410 are compared to higher order address bits. By feeding the output of the comparator 412 to an AND gate 414 that also receives the single externally supplied chip select signal (CS#) 104, the internal chip select 110 for a device will be asserted (or de-asserted) when there is a match between the address bits and the device ID.

When a diagnostic mode is entered, as determined at step 508, a host may be able to set and load a new device ID, overriding the default setting, at step 510.

In the diagnostic mode, the circuit of FIG. 4 allows the reprogramming of the device ID for each of the plurality of memory devices via software. In this mode, the select line 408 may control the mux to output new device ID bits provided on external pins 416 (DQ lines in the illustrated example) rather than the default ID bits. These bits may be loaded into the device ID register latches 410, writing over the default ID bits loaded on reset.

As will be described in greater detail below, reprogramming of device IDs may be done in response to detection of a faulty memory die when the circuit is in diagnostic mode. Regardless of the reason for reprogramming, normal operations may be resumed, at step 506, using the newly latched device IDs.

Figure 6:
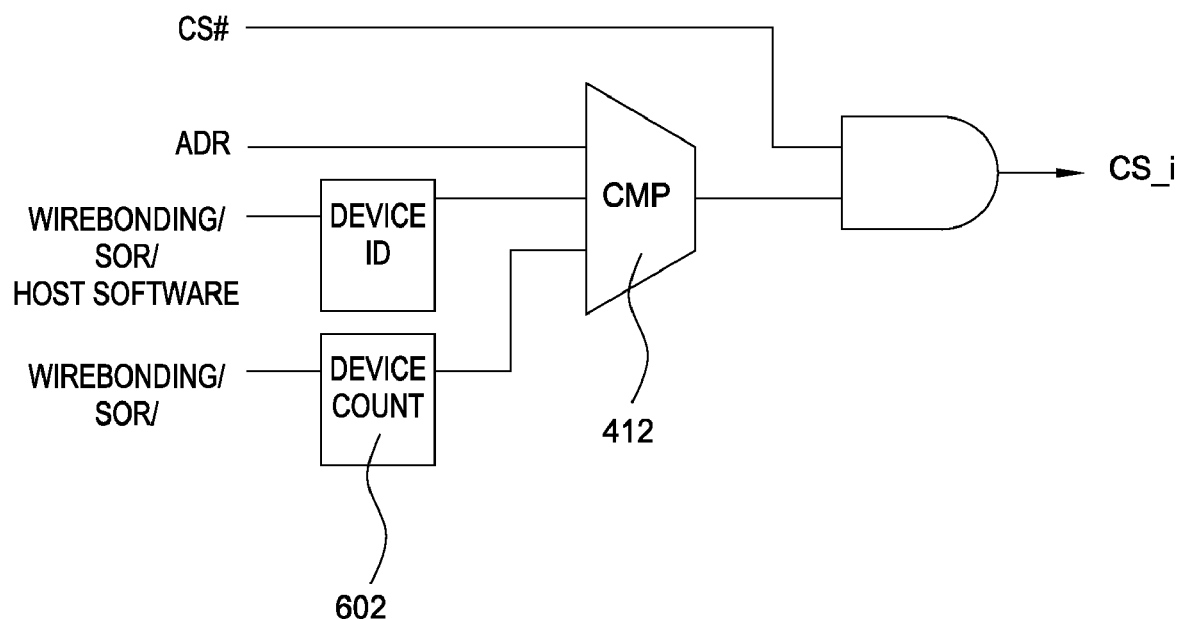
FIG. 6 illustrates an example internal chip select circuit according to one embodiment of the present invention.

The number of higher-order address bits needed to compare against the device ID can vary depending on the number of devices in the system. FIG. 6 illustrates an implementation for determining the number of higher-order address bits needed. Referring to FIG. 6, a comparator 412 can use a device count register latch 602 to determine the needed number of address bits to compare against the device ID. The device count register latch 602 may be set, either by wire bonding or SOR, with the number of devices (device count) in the system. The number of higher-order bits may then be calculated by applying the $\log_2 N$, where N is equal to the device count. As an alternative, the number of address bits may be reduced by using additional external chip select lines, albeit at the expense of consuming external pins.

Figure 7:
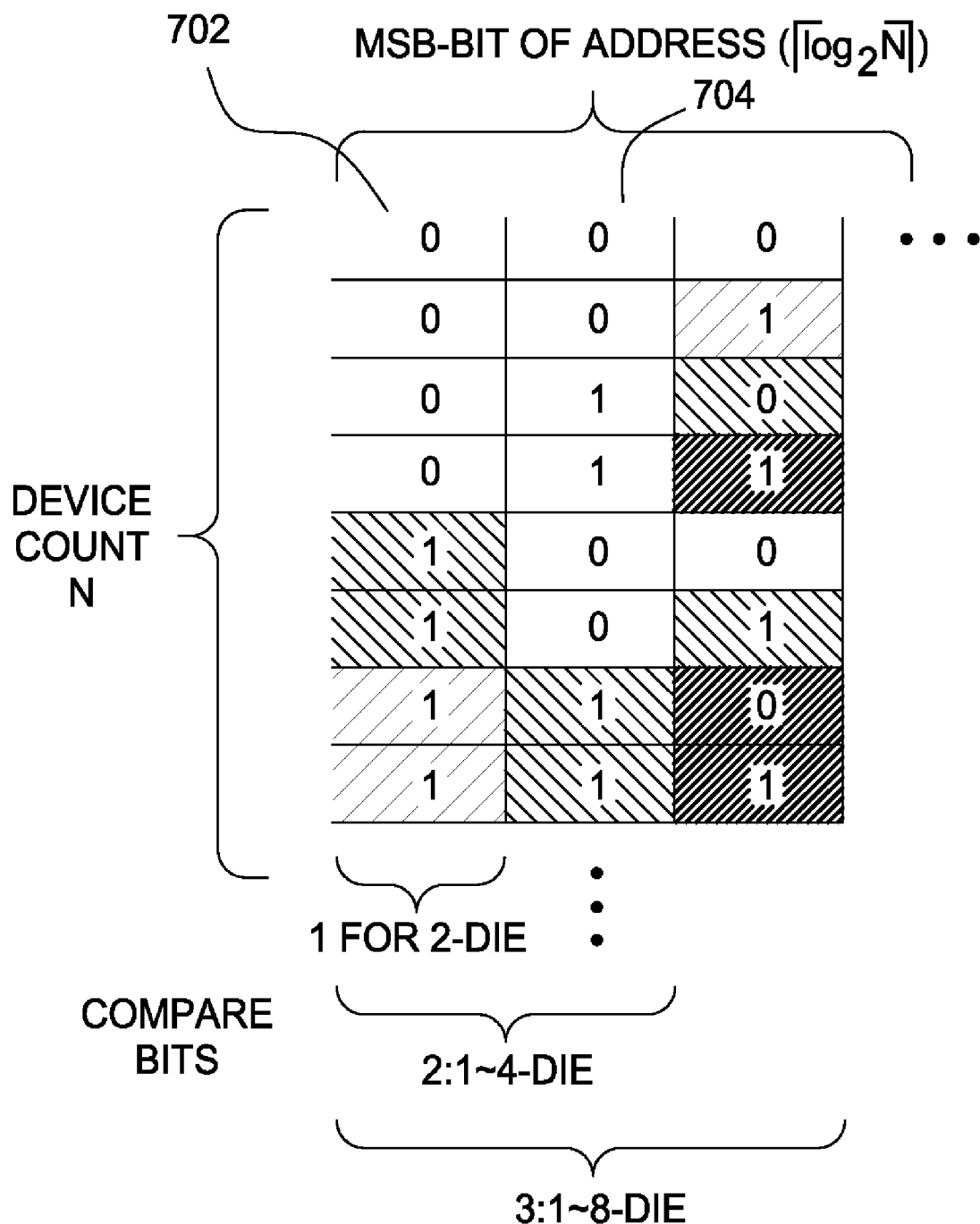
FIG. 7 is a diagram representing a behavior of an internal chip select circuit according to the present invention.

FIG. 7 illustrates the need for more higher-order address bits as the number of devices increases. Column 1 702 represents the most significant bit (MSB) of the address. Column 2 704 represents the second MSB of the address, etc. In a system of one or two devices, only the first MSB of the address is needed to compare against the device ID. In a system of three to four devices, the two MSB's of the address are needed to compare against the device ID, etc.

FIG. 8 illustrates another embodiment of the invention, where a single chip select can be used for flexible memory segment assignment. FIG. 8 merely illustrates that before assignment 802, the memory segments can be aligned in consecutive order. After assignment 804, the memory segments can be aligned out of sequence.

Figure 9:
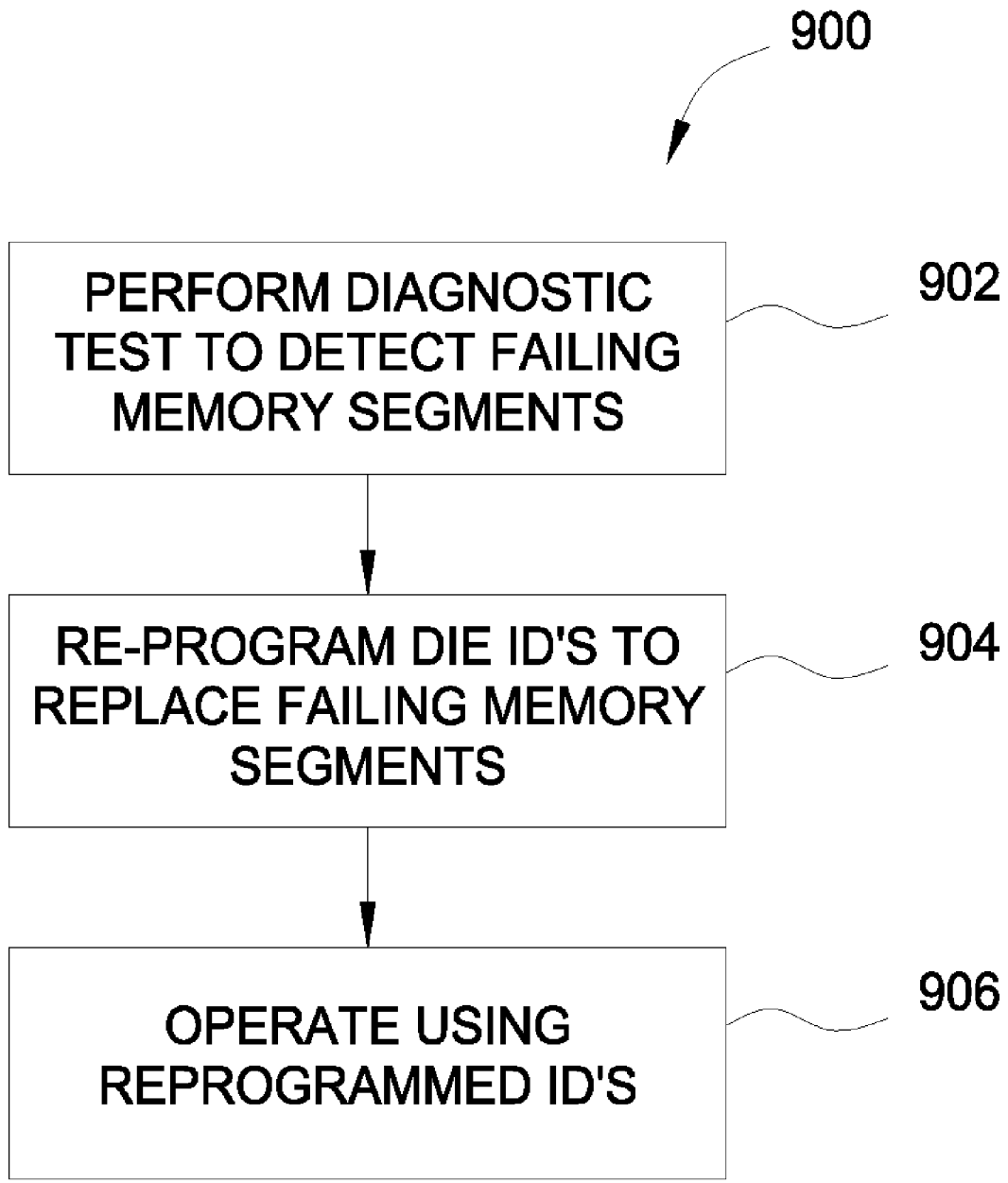
FIG. 9 illustrates example operations for replacing failing memory segments according to one embodiment of the present invention.

As stated earlier, an embodiment of the invention can include a diagnostic mode used to detect faulty memory regions. FIG. 9 illustrates example operations 900 for running the diagnostic mode. At step 902, a diagnostic test is performed to detect failing memory dies. At step 904, the die ID's are re-programmed to replace a failing die with, for example, a redundant memory device, assuming a failing die was found. Finally, at step 906, normal operations may be resumed using the re-programmed ID's.

The flexibility of re-programming memory space is illustrated in FIGS. 10A-10D. FIGS. 10A and 10B illustrate how device IDs may be easily mapped to different logical spaces, which may be advantageous, for example, to locate a first type of memory device (e.g., DRAM) to a first logical space, while locating a second type of memory device (e.g., flash memory) to a second logical space.

FIGS. 10C and 10D illustrate how a failing memory segment may be replaced. The example assumes that a DIE 2 is mapped to a logical space (2), while a DIE N is initially unused. For example, DIE N may be assigned a device ID corresponding to logical space outside of a usable range, such that it is never selected. However, upon detecting DIE 2 has a defect, the device IDs may be reprogrammed (e.g., via the techniques described above) such that DIE N is assigned the device ID previously assigned to DIE 2 (corresponding to logical space 2), while DIE 2 is assigned the device ID previously assigned to DIE N (outside of the usable logical space).

Figure 11:
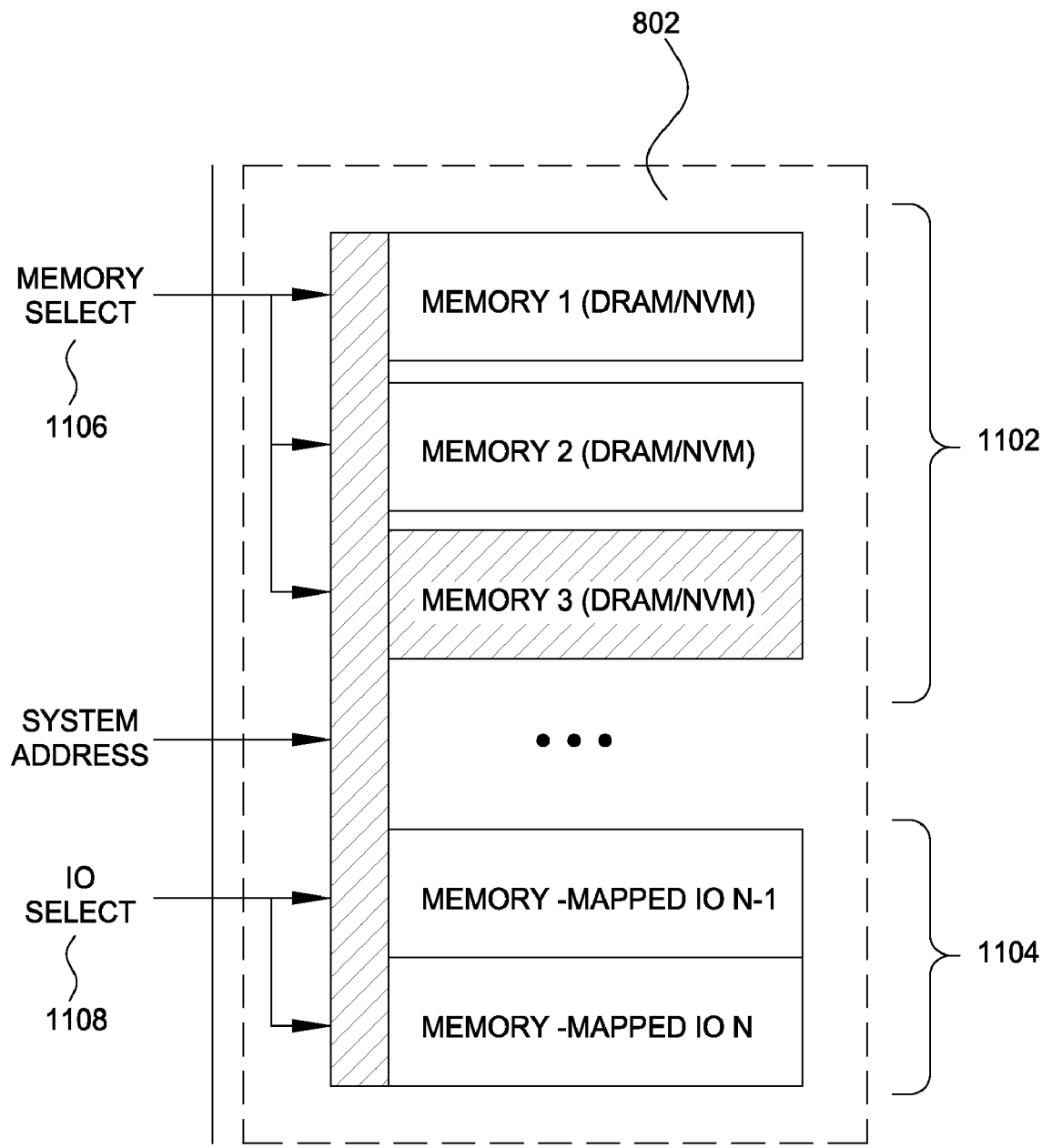
FIG. 11 illustrates assignable memory-mapped I/O selects according to one embodiment of the present invention.

The techniques described herein may also be utilized to allow for flexible memory segment assignment for memory-mapped I/O as well. FIG. 11 illustrates a system having a plurality of memory segments 1102 along with a plurality of memory-mapped I/O segments 1104. As illustrated, a single memory chip select 1106 can be used for the memory segments 1102, and a single I/O chip select 1108 can be used for the memory-mapped I/O segments 1104. Alternatively, a single chip select can be used for both the memory segments 1102 and the memory-mapped I/O segments 1104.

While the foregoing is directed to embodiments of the present invention, other and further embodiments of the invention may be devised without departing from the basic scope thereof, and the scope thereof is determined by the claims that follow.

What is claimed is:

1. A multi-chip package comprising:
   at least one chip select pin for receiving a single external chip select signal;
   a plurality of stacked memory devices, where each memory device is responsive to an individual internal chip select and is assigned a different multi-bit device identification (ID); and
   one or more chip select logic circuits configured to generate the individual internal chip select for each of the plurality of stacked memory devices based on the external chip select signal and whether one or more external bits match the device ID.

2. The multi-chip package of claim 1, wherein the plurality of stacked memory devices comprise a dynamic random access memory device.

3. The multi-chip package of claim 1, wherein the plurality of stacked memory device comprise a non-volatile memory.

4. The multi-chip package of claim 1, where the plurality of stacked memory devices comprise a combination of a dynamic random access memory and a non-volatile memory.

5. The multi-chip package of claim 1, wherein a logic circuit for generating an internal chip select is located on each memory device.

6. The multi-chip package of claim 1, wherein a logic circuit for generating the internal chip selects is located in the MCP external to the memory devices.

7. The multi-chip package of claim 1, wherein the device identification register is set at a fixed configuration via wire-bonding.

8. The multi-chip package of claim 1, wherein the device identification register is set during reset using a sense-on-reset.

9. The multi-chip package of claim 1, further comprising a logic circuit allowing for external programming of the device IDs.

10. The multi-chip package of claim 1, wherein the memory devices comprise at least one dynamic random access memory (DRAM) device and at least one non-volatile memory device which both share a common interface.

11. A method of selecting stacked devices in a multi-chip package (MCP), comprising:
    receiving a single chip select signal from a source external to the MCP;
    receiving a plurality of address bits;
    in response to receiving the single chin select signal and the plurality of address bits, identifying one of the stacked devices to select based on a match between the address bits and a corresponding device identification (ID) bits assigned to the identified device; and
    asserting a chip select to select the identified device.

12. The method of claim 11, wherein the identifying and asserting is performed in logic circuits internal to the devices.

13. The method of claim 11, wherein the identifying and asserting is performed in a logic circuit within the MCP, but external to the devices.

14. The method of claim 11, further comprising:
    assigning the device ID bits to each device.

15. The method of claim 14, wherein assigning the device ID bits to each device comprises latching one or more logic values into a register upon reset.

16. The method of claim 15, wherein assigning the device ID bits to each device further comprises over writing the latched device ID bits with device ID bits received from an external device.

17. A system, comprising:
    a controller; and
    a multi-chip package having at least one chip select pin for receiving a single external chip select signal from the controller, a plurality of stacked memory devices, where each memory device is responsive to an individual internal chip select and is assigned a different multi-bit device identification (ID), and one or more chip select logic circuits configured to generate, the individual internal chip select for each of the plurality of memory devices based on the external chip select signal and whether one or more external bits match the device ID.

18. The system of claim 17, wherein the plurality of stacked memory devices comprises at least one volatile memory device and at least one non-volatile memory device.

19. The system of claim 17, wherein the one or more logic circuits are configured to latch default device IDs into a register upon reset.

20. The system of claim 19, wherein the controller is configured to overwrite the default device IDs with new device IDs.

* * * * *